(12) United States Patent
Dohner et al.

(10) Patent No.: US 11,063,191 B2
(45) Date of Patent: Jul. 13, 2021

(54) FORMING A MULTICOLOR PHOSPHOR-CONVERTED LED ARRAY

(71) Applicant: Lumileds LLC, San Jose, CA (US)

(72) Inventors: Emma Dohner, Redwood City, CA (US); Kentaro Shimizu, Sunnyvale, CA (US); Hisashi Masui, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/653,414

(22) Filed: Oct. 15, 2019

(65) Prior Publication Data

US 2021/0111315 A1 Apr. 15, 2021

(51) Int. Cl.
*H01L 33/00* (2010.01)
*H01L 33/50* (2010.01)
*H01L 25/075* (2006.01)

(52) U.S. Cl.
CPC ........ *H01L 33/505* (2013.01); *H01L 25/0753* (2013.01); *H01L 2933/0041* (2013.01)

(58) Field of Classification Search
CPC ... H01L 25/0753; H01L 25/50; H01L 25/167; H01L 33/505; H01L 33/62; H01L 33/507; H01L 33/508; H01L 33/54; H01L 33/504; H01L 2933/0041; H01L 2933/0033; H01L 2933/0066; H01L 2933/005
See application file for complete search history.

(56) References Cited

U.S. PATENT DOCUMENTS 8,546,159 B2 * 10/2013 Yoo .................. H01L 33/505
438/27
2011/0014732 A1 * 1/2011 Lee .................. H05K 3/284
438/27
(Continued)

FOREIGN PATENT DOCUMENTS

EP 2610058 A1 7/2013
WO 9748138 A2 12/1997
(Continued)

OTHER PUBLICATIONS

Hu et al., "Improving transparency of stretched PET/MXD6 blends by modifying PET with isophthalate", 2005, Polymer 46 (2005) 5202-5210 (published May 5, 2005).*
(Continued)

*Primary Examiner* — Nikolay K Yushin

(57) ABSTRACT

A phosphor carrier assembly includes a substrate, a thermal or UV activated release adhesive, a layer containing a pixelated phosphor array, and a partially cured or highly viscous adhesive. The phosphor pixels on the carrier are typically all of the same color. In formation of a phosphor converted LED array the phosphor pixels on the carrier assembly are aligned with and placed in contact with corresponding LED pixels in an array of pixelated LED dice. Selected phosphor pixels on the carrier assembly may then be attached to corresponding LED pixels, and released from the substrate, by powering (activating) the corresponding LED pixels to heat the selected phosphor pixel to a temperature that releases the thermal release adhesive and that cures or partially cures the adhesive on the selected phosphor pixels in contact with the corresponding LED pixels.

18 Claims, 4 Drawing Sheets

(56) References Cited

U.S. PATENT DOCUMENTS

| | | |
|---|---|---|
| 2012/0052608 A1 | 3/2012 | Yoo et al. |
| 2015/0171287 A1 | 6/2015 | Matsumura et al. |
| 2017/0263826 A1 | 9/2017 | Huska et al. |
| 2017/0294563 A1 | 10/2017 | Hashimoto |
| 2019/0237637 A1 | 8/2019 | Cheng et al. |

FOREIGN PATENT DOCUMENTS

| | | |
|---|---|---|
| WO | 2012032052 A1 | 3/2012 |
| WO | 2014016299 A1 | 1/2014 |
| WO | 2015/004577 A1 | 1/2015 |

OTHER PUBLICATIONS

Extended European Search Report, EP Application No. 20157722.8, dated Jul. 16, 2020, 9 pages.

From the EPO as the ISA, Notification of Transmittal of the International Search Report and the Written Opinion of the International Searching Authority, or the Declaration, PCT/US2020/055729, dated Jan. 28, 2021, 17 pages.

\* cited by examiner

FORMING A MULTICOLOR PHOSPHOR-CONVERTED LED ARRAY

FIELD OF THE INVENTION

The invention relates generally to phosphor-converted light emitting diodes.

BACKGROUND

Red-Green-Blue (RGB) microLED displays are expected to be the next generation of display technology, due to superior image quality, lower power consumption, and increased reliability. Currently, several methods exist to form large arrays of multi-color, micron-scale, and closely spaced pixels. One option is to assemble each pixel from individual red, green, and blue LED dice. Another option is to pattern red and green subpixels onto a blue pixelated die, either via a stamp process, photolithography or ink-jet printing.

SUMMARY

This disclosure describes a monolithic approach to manufacturing a high density patterned or multi-color phosphor converted LED array, without serial pick and place steps for every single pixel. This avoids the significant attach accuracy issues of serial pick and place, which leads to wide gaps between neighboring pixels. Unlike stamp-based approaches, there is no additional patterning step required before the attach process—color selectivity occurs during phosphor integration. By using a monolithic approach and a one-step per color attach, accuracy can be enhanced. Additionally, yield improvements can be addressed by incorporating a small number of error correction steps in the phosphor placement process.

In the methods disclosed herein, a layered carrier assembly includes, in order, a substrate, e.g. PET, a thermal or UV activated release adhesive, a layer containing a segmented (pixelated) phosphor array, and a partially cured or highly viscous silicone adhesive. The phosphor pixels on a carrier are typically all of the same color.

In formation of a phosphor converted LED array by these methods, the phosphor pixels on the layered carrier assembly are aligned with and placed in contact with corresponding LED pixels in an array of pixelated LED dice, which may for example have a Thin-Film Flip Chip (TFFC) architecture. Selected phosphor pixels on the carrier assembly may then be attached to corresponding LED pixels, and released from the substrate, by powering (activating) the corresponding LED pixels to heat the selected phosphor pixel to a desired temperature. This releases the thermal release adhesive attaching the selected phosphor pixels to the carrier substrate and cures or partially cures the adhesive on the selected phosphor pixels in contact with the corresponding LED pixels. Thus, the step of attaching selectively bonds pixels of the phosphor layer to corresponding pixels of the array of pixelated dice. The layered carrier assembly and un-bonded phosphor pixels may then be removed, for example with a process tape attached (e.g., laminated) to a backside of the substrate.

If a UV release adhesive is used instead of or in addition to the thermal release adhesive, then UV light emitted by a GaN LED may release the corresponding phosphor pixel from the carrier.

This process may be repeated with phosphor pixel arrays of different color to produce a multicolour phosphor converted LED array. The final device structure may be further heated such that the silicone adhesive strongly bonds the phosphor pixels to the LED pixels.

By using a pre-formed phosphor layer, the color control and yield can be highly controlled by pre-testing and selecting only known-good-phosphor for integration.

These and other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

The term "GaN LED" is used herein to refer to III-Nitride LEDs, i.e., to LEDs formed in the AlInGaN material system. The examples below are describe with reference to such GaN LEDs, but the methods described herein may be used with III-Phosphide (AlInGaP material system) LEDs or with LEDs formed in any other suitable material system.

Figure 1:
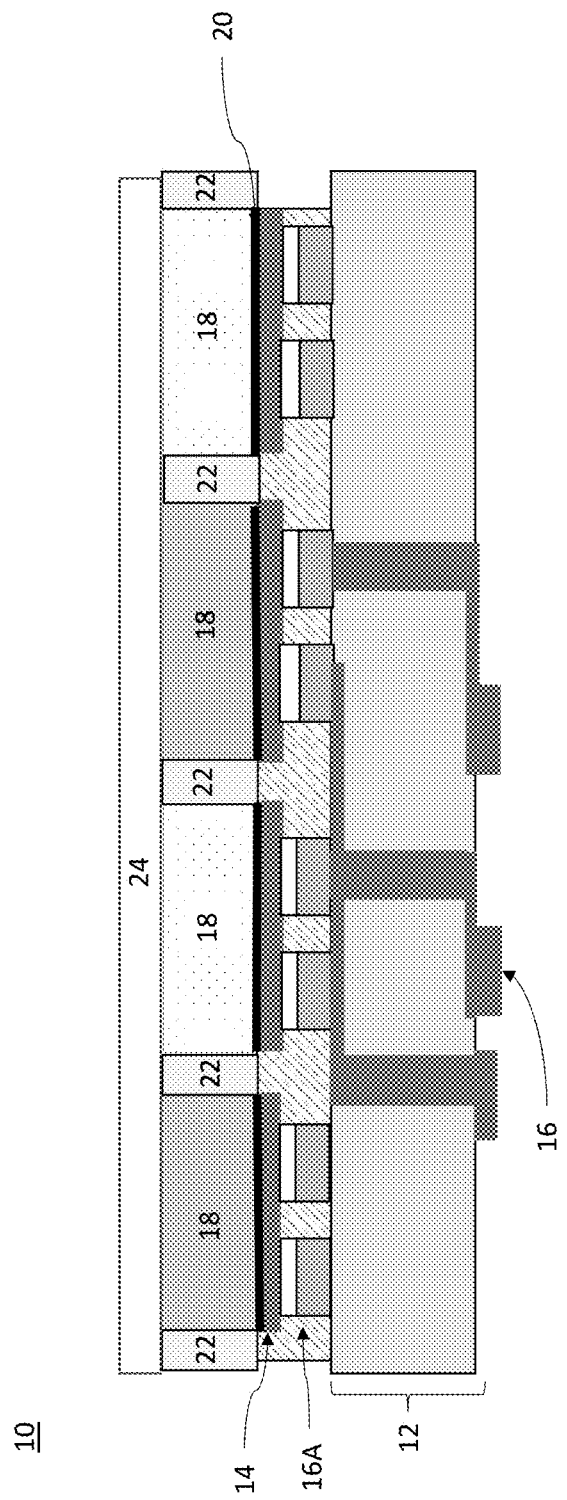
FIG. 1 is a cross-sectional schematic diagram of close packed array of multi-colored phosphor converted LEDS on a monolithic die and substrate.

FIG. 1 is a schematic cross-sectional view of a close packed array 10 of multi-colored, phosphor converted LEDs on a monolithic die and substrate 12, prepared by the methods disclosed herein. The side view shows GaN LEDs 14 attached to the substrate 12 through metal interconnects 16A (e.g., gold-gold interconnects or solder attached to copper micropillars) and metal interconnects 16. Phosphor pixels 18 are attached to corresponding GaN LEDs 14 though an adhesive layer 20, which may be a silicone adhesive layer for example. The pixels of the phosphor array 18 are coated on their sides with a reflective mirror or diffusive scattering layer 22. The phosphor pixels may be the same height for a single color or more likely of varying heights in multi-color applications based on the color point and sequential nature of the attach process, in which case typically phosphor pixels of the last color deposited will be the thickest (tallest). Optionally, a buffer layer or clear layer 24 may be disposed on top of the phosphor array 18. This helps to maintain the color point and also normalizes the thickness or height variation on the phosphor layer 18. This also helps when removing excess material applied as a reflective side coating to the phosphor pixels.

As summarized above and further explained below with reference to the figures, self-heating of the LED pixels and corresponding phosphor pixels during operation of the LED dice is used to selectively bond pixels from a phosphor array to corresponding GaN LED pixels to form the phosphor converted LED array.

Figure 2:
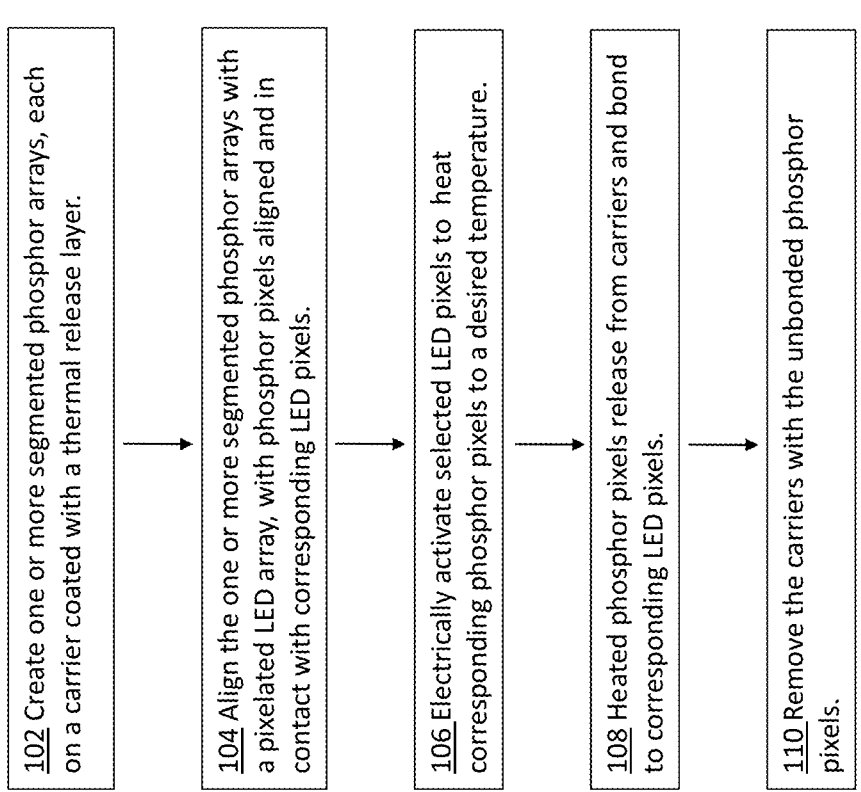
FIG. 2 is a process flowchart according to the invention.
Figure 3:
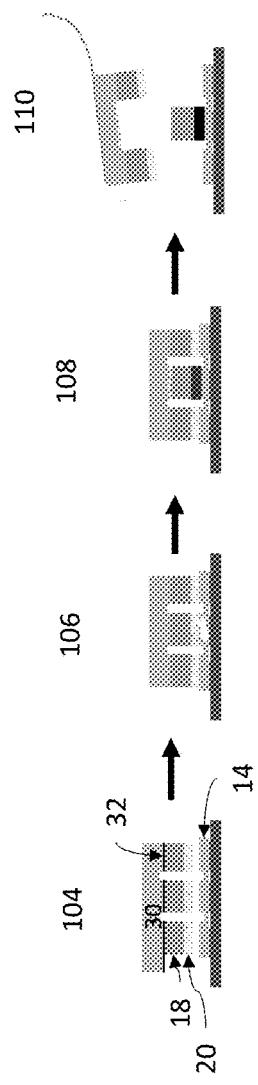
FIG. 3 schematically illustrates a single color pass—selective attachment of phosphor pixels of one color—according to an example method of the invention.

FIG. 2 is a process flowchart for example methods of the invention. FIG. 3 illustrates the device structure at various stages of a single pass of phosphor pixel deposition by such methods.

In step 102, a segmented phosphor array is created on a carrier 30 coated with a releasable adhesive 32, e.g. a thermal release layer. This array can be formed by dicing a layer that contains phosphor, or by other methods such as a lithographic or ablation process. The phosphor layer material may be, for example, phosphor/silicone, ceramic phosphor, phosphor in glass, and phosphor on glass. Before or after the phosphor layer segmentation step, the surface of the phosphor layer (or of each phosphor pixel) opposite from the surface attached to the carrier is coated with a thermally-activated LED grade silicone or epoxy adhesive 20 (low adhesion/G' at room temperature, increased adhesion at higher temperatures).

The carrier may be for example a substrate of PET, sacrificial polymer, glass, or silicon. The releasable adhesive layer may be a thermal or UV activated release adhesive. The thermal or UV release adhesive has a shear storage modulus G'>300 KPa at room temperature, which drops below 300 KPa at given elevated temperature to achieve adhesion with the carrier substrate. Suitable layered carrier assemblies, e.g. Nitto Revalpha and Adwill D510, include the substrate and thermal activated release adhesive. The phosphor layer contains a segmented phosphor array, and a partially cured or highly viscous silicone adhesive disposed on a surface of the phosphor pixels opposite from the carrier substrate.

During mechanical or chemical segmentation, the phosphor layer may be diced into M×N arrays such that there are major and minor gaps in the phosphor layer. The major gaps penetrate fully through the carrier to singulate the array into pixels. The minor gaps cut through phosphor, but stop in the carrier layer, thus creating sub-pixels.

In step 104, the segmented phosphor array is aligned with and placed in contact with an LED array so that individual phosphor pixels are aligned with and optionally weakly bonded to corresponding pixels in the array of LEDs.

In step 106, a selected subset of the pixels of the LED array is electrically turned on. During this operation, at step 108 the surface of the selected LED pixels rapidly heats up, reaching temperatures high enough (100-150 C) to cause the thermally-activated adhesive between the die and phosphor pixels to reflow, creating a strong bond between the selected die and phosphor pixel. Simultaneously, down-conversion in the phosphor layer results in additional heating of the phosphor pixel, reaching temperatures of 150-200 C. This results in the release of that phosphor pixel from the thermal release layer on the carrier.

In step 110, the carrier is removed. The initially selected subset of pixels will be bonded to the LED (as shown in FIG. 3A), while the rest will remain on the carrier.

Figure 4:
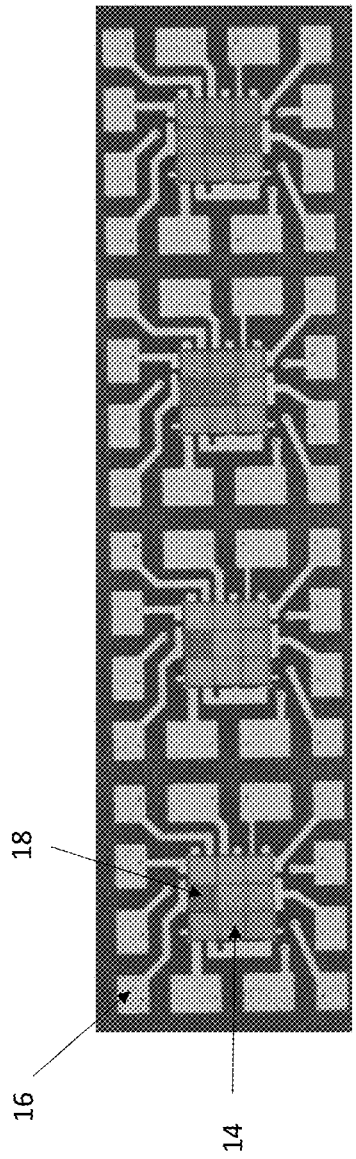
FIG. 4 shows a top view of three pixelated LED dice to which phosphor pixels have been selectively attached by methods as described herein.

FIG. 4 shows a top view of three 3×3 pixelated LED dice to which phosphor pixels have been selectively attached by methods as described herein. Metal interconnects 16 arranged on a substrate allow individual LED pixels of each die to be separately operated. Phosphor pixels 18 have been attached to underlying LED pixels by operation of the LED pixels as described above. Exposed GaN LED pixels 14 were not operated during the phosphor attachment step.

Figure 5:
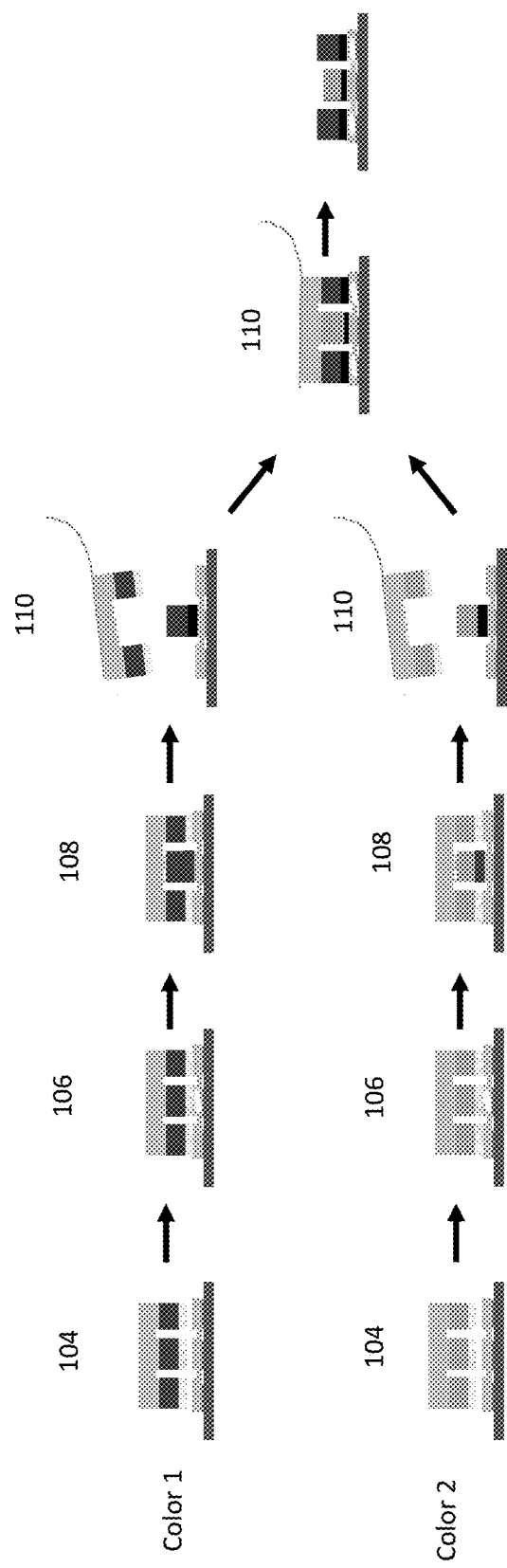
FIG. 5 schematically illustrates multiple color passes according to an example method of the invention, in which phosphor pixels of a first color are selectively attached to a pixelated LED, and then phosphor pixels of another color are selectively attached to the pixelated LED.

As summarized above, steps 102-110 may be repeated with different segmented phosphor arrays to yield a multi-colored phosphor-converted LED array. Here, the un-bonded phosphor pixels remaining on the carrier form a patterned stamp, which can then be bonded to a complimentary partial array of a different phosphor color. FIG. 5 schematically illustrates an example of such sequential deposition of two different colors of phosphor pixels by the methods described herein. For color 1, steps 104-110 are performed to deposit a pixel of color 1 on a first pixelated LED die. For color 2, steps 104-110 are performed to deposit a pixel of color 2 on a second pixelated LED die. After the initial deposition step, the color 1 carrier has phosphor pixels and gaps arranged in a manner that complements the position of the color 2 pixel on the second pixelated LED die. Steps 104-110 may then be performed using the color 1 carrier and the second pixelated LED die to selectively deposit color 1 pixels on the second pixelated LED die, forming a multicolour phosphor-converted LED array. A similar process may be performed with the color 2 carrier and the first pixelated LED die.

In one example, a silicone/phosphor film is fully cured and then laminated onto a PET substrate coated with a thermal release adhesive. A thin layer of silicone adhesive is deposited onto the phosphor film surface via spin-coating, after which excess solvent is removed with a short bake step. The phosphor film/PET stack is then diced into 3×3 arrays, where every third saw line cuts fully through the PET to singulate the arrays (other saw lines cut through phosphor, but stop in PET layer). The arrays are then aligned and attached onto a pixelated TFFC die using a pick-and-place tool. No elevated temperature or force is used during the attach process, leading to a weak bond between the die and the silicone adhesive on the phosphor pixels. Electrical contact is then made to power a selected pattern of die pixels, which are run at a set current for a certain length of time (in the case of devices shown in FIG. 4, 4 A/mm$^2$ for 15 seconds). A tape is laminated to the top of the PET carrier and then used to remove the PET carrier and un-bonded phosphor pixels.

Although the thermally-released carrier is removed at the end of the attach process, this process requires a thermally activated glue layer 20 between the phosphor layer and the die surface. The presence of this glue layer and the fully aligned segmentation of both the glue layer and phosphor layer will indicate the use of this process. Other indicators of this method may include the different heights of the phosphor layer depending on the number of steps to integrate the various colors/pixel arrays. Finally, the metal traces/tie bars used to electrically activate the appropriate pixels during the attach process should also be indicative of the use of this invention.

This disclosure is illustrative and not limiting. Further modifications will be apparent to one skilled in the art in light of this disclosure and are intended to fall within the scope of the appended claims. One of skill can extend the disclosed invention to vertical thin film (VTF) and similar LED architectures.

We claim:

1. A method for manufacturing a phosphor converted LED array, the method comprising:
   positioning an LED array comprising LED pixels and a phosphor structure comprising phosphor pixels with the LED pixels of the LED array aligned with and in contact with corresponding ones of the phosphor pixels of the phosphor structure; and electrically operating selected ones of the LED pixels to emit light and to heat the corresponding phosphor pixels to a temperature that bonds each of the selected LED pixels to the corresponding phosphor pixel.

2. The method of claim 1 wherein all of the phosphor structure pixels of the phosphor structure are of a first color, the method further comprising:

positioning the LED array and a second phosphor structure comprising phosphor pixels of a second color different from the first color with LED pixels of the LED array that are not bonded to a phosphor pixel of the first color aligned with and in contact with corresponding ones of the phosphor pixels of the second phosphor structure; and electrically operating selected ones of the LED pixels to emit light and to heat their corresponding phosphor pixels of the second phosphor structure to a temperature that bonds each of the selected LED pixels to the corresponding phosphor pixel of the second phosphor structure.

3. The method of claim 1 wherein the phosphor pixels comprise material selected from a group consisting of phosphor/silicone, ceramic phosphor, phosphor in glass, and phosphor on glass.

4. The method of claim 1, wherein the phosphor structure comprises a substrate and surfaces of the phosphor pixels opposite from the LED array are attached to the substrate by a UV releasable adhesive, and operating the selected ones of the LED pixels to emit UV light releases the corresponding phosphor pixels from the substrate.

5. The method of claim 4, comprising removing from the LED array the phosphor structure substrate and phosphor pixels not released from the substrate.

6. The method of claim 1, wherein the phosphor structure comprises a substrate and surfaces of the phosphor pixels opposite from the LED array are attached to the substrate by a thermally releasable adhesive, and operating the selected ones of the LED pixels to emit light heats the corresponding phosphor pixels to a temperature that releases the corresponding phosphor pixels from the substrate.

7. The method of claim 6, comprising removing from the LED array the phosphor structure substrate and phosphor pixels not released from the substrate.

8. The method of claim 6 wherein the substrate includes a PET carrier.

9. The method of claim 6 wherein electrically operating the selected ones of the LED pixels to emit light heats the thermally releasable adhesive to a temperature of 150 C to 220 C.

10. The method of claim 1 wherein:

the phosphor structure comprises a substrate, a releasable adhesive coating a surface of the substrate, a phosphor layer disposed on the releasable adhesive coating and attached by the releasable coating to the substrate, and a thermally activated adhesive disposed on a surface of the phosphor layer opposite from the releasable adhesive; and electrically operating the selected ones of the LED pixels to emit light heats the thermally activated adhesive disposed on the corresponding phosphor pixels to a temperature that cures the thermally activated adhesive to bond the selected LED pixels to the corresponding phosphor pixels.

11. The method of claim 10 wherein electrically operating the selected ones of the LED pixels to emit light heats the thermally activated adhesive disposed on the corresponding phosphor pixels to a temperature of 100 C to 150 C.

12. The method of claim 10 wherein the thermally activated adhesive includes a thermally activated silicone adhesive.

13. The method of claim 10 wherein the thermally activated adhesive includes a thermally activated epoxy adhesive.

14. The method of claim 10 wherein the thermally activated adhesive has a refractive index of 1.41 to 1.6.

15. The method of claim 10 wherein the substrate includes a PET carrier.

16. The method of claim 10, wherein the releasable adhesive is a thermally releasable adhesive, and electrically operating the selected ones of the LED pixels to emit light heats the thermally releasable adhesive to a temperature that releases the corresponding phosphor pixels from the substrate.

17. The method of claim 16, wherein electrically operating the selected ones of the LED pixels to emit light heats the thermally releasable adhesive to a temperature of 150 C to 220 C.

18. The method of claim 16, comprising removing from the LED array the substrate and phosphor pixels not released from the substrate.

* * * * *